United States Patent
Kuhman et al.

[11] Patent Number: 5,900,288
[45] Date of Patent: May 4, 1999

[54] METHOD FOR IMPROVING SUBSTRATE ADHESION IN FLUOROPOLYMER DEPOSITION PROCESSES

[75] Inventors: Daniel E. Kuhman; Thomas E. Orlowski, both of Fairport, N.Y.

[73] Assignee: Xerox Corporation, Stamford, Conn.

[21] Appl. No.: 08/722,517

[22] Filed: Sep. 27, 1996

Related U.S. Application Data

[63] Continuation of application No. 08/176,972, Jan. 3, 1994, abandoned.

[51] Int. Cl.$^6$ .............................. C23C 14/02; C08J 7/18; H05H 1/24; B08B 7/00
[52] U.S. Cl. ..................... 427/534; 427/536; 427/490; 427/577; 427/249; 427/255.8; 216/67; 134/1.1
[58] Field of Search ..................................... 427/490, 491, 427/534, 577, 536, 535, 249, 255.8; 134/1.1, 1.2; 216/67

[56] References Cited

U.S. PATENT DOCUMENTS

| | | | |
|---|---|---|---|
| 4,463,359 | 7/1984 | Ayata et al. | 346/1.1 |
| 4,551,778 | 11/1985 | Arai et al. | 427/490 |
| 4,601,777 | 7/1986 | Hawkins et al. | 156/626 |
| 4,774,530 | 9/1988 | Hawkins | 156/147 |
| 4,786,352 | 11/1988 | Benzing | 134/1.1 |
| 4,889,767 | 12/1989 | Yokoyama et al. | 427/490 |
| 4,950,543 | 8/1990 | Winter et al. | 427/39 |
| 4,960,609 | 10/1990 | Homola et al. | 427/490 |
| 5,043,747 | 8/1991 | Ebisawa et al. | 346/140 |
| 5,073,785 | 12/1991 | Jansen et al. | 347/45 |
| 5,129,958 | 7/1992 | Nagashima et al. | 216/67 |
| 5,221,414 | 6/1993 | Langley et al. | 427/534 |
| 5,244,730 | 9/1993 | Nguyen et al. | 427/490 |
| 5,308,950 | 5/1994 | Ramm et al. | 216/67 |
| 5,387,310 | 2/1995 | Shiomi et al. | 117/101 |
| 5,403,436 | 4/1995 | Fujimura et al. | 156/662 |
| 5,632,821 | 5/1997 | Doi | 134/1.1 |
| 5,773,098 | 6/1998 | Thomas | 427/534 |

FOREIGN PATENT DOCUMENTS

| | | |
|---|---|---|
| 0259792 | 3/1988 | European Pat. Off. . |
| 0259792 A1 | 3/1988 | European Pat. Off. . |
| 0625588 | 11/1994 | European Pat. Off. . |
| 39 21 652 | 1/1991 | Germany . |
| 56-123377 | 9/1981 | Japan . |
| 58-190898 | 11/1983 | Japan . |
| 1-050235 | 2/1989 | Japan . |
| 4-165075 | 6/1992 | Japan . |
| 5-298689 | 11/1993 | Japan . |

OTHER PUBLICATIONS

J. P. Simko et al., "Removal of Fluorocarbon Residues on CF4/H2 Reactive–Ion–Etched Silicon Surfaces Using A Hydrogen Plasma", *Journal of the Electrochemical Society*, vol. 138, No. 1, Jan. 1991, pp. 277–284.

M. E. Lin et al., "GaN grown on hydrogen plasma cleaned 6H–SiC substrates", *Aplied Physics Letters*, vol. 62, No. 7, Feb. 15, 1993, pp. 702–704.

*Primary Examiner*—Marianne Padgett
*Attorney, Agent, or Firm*—Oliff & Berridge, PLC

[57] ABSTRACT

A method of cleaning a substrate, in particular, the front face of a thermal ink jet printing device, to improve subsequent thin film deposition in a single chamber plasma processing system containing fluorine-containing deposits, involves treating the substrate with a hydrogen plasma. A front face coating for a thermal ink jet device may be formed by a method involving (1) treating a substrate of the thermal ink jet device with a hydrogen plasma; (2) optionally coating the cleaned substrate with an amorphous carbon layer; and (3) coating the substrate or amorphous carbon layer with a fluoropolymer layer.

20 Claims, 3 Drawing Sheets

METHOD FOR IMPROVING SUBSTRATE ADHESION IN FLUOROPOLYMER DEPOSITION PROCESSES

This is a Continuation of application Ser. No. 08/176,972 filed Jan. 3, 1994, now abandoned

BACKGROUND OF THE INVENTION

This invention relates to a method of cleaning a surface to be subsequently coated, such as the front face of a thermal ink jet printing device. More particularly, this invention relates to a method of cleaning a substrate so as to improve the adhesion between a substrate and a carbon layer or a fluoropolymer layer in fluoropolymer deposition processes.

Amorphous or diamond-like carbon films are known in the art. Reference is made, for example, to U.S. Pat. No. 5,073,785, which is incorporated by reference herein in its entirety. These films are quite useful for many applications, including coating applications, because of their mechanical properties, extended wearability and phobic or shunning properties for many dye and water-based ink formulations.

Fluoropolymer films are also useful for many coating applications because of their ink repellant properties. Typically, an underlayer, such as an amorphous or diamond-like carbon layer, is used between a substrate and the fluoropolymer film to promote adhesion and improve durability.

U.S. Pat. No. 4,601,777 to Hawkins et al. discloses several fabricating processes for ink jet printheads, each printhead being composed of two parts aligned and bonded together. One part is substantially a flat heater plate substrate which contains on the surface thereof a linear array of heating elements and addressing electrodes, and the second part is a channel plate substrate having at least one recess anisotropically etched therein to serve as an ink supply manifold when the two parts are bonded together. A linear array of parallel grooves is formed in the second part, so that one set of ends of the grooves communicates with the manifold recess and the other ends are open for use as ink droplet expelling nozzles. Many printheads can be simultaneously made by producing a plurality of sets of heating element arrays with their addressing electrodes on, for example, a silicon wafer and by placing alignment marks thereon at predetermined locations. A corresponding plurality of sets of channels and associated manifolds is produced in a second silicon wafer and, in one embodiment, alignment openings are etched thereon at predetermined locations. The two wafers are aligned via the alignment openings and alignment marks and then bonded together and diced into many separate printheads.

In existing thermal ink jet printing, the printhead comprises one or more ink filled channels, such as disclosed in U.S. Pat. No. 4,463,359 to Ayata et al., communicating with a relatively small ink supply chamber at one end and having an opening at the opposite end, referred to as a nozzle. A thermal energy generator, usually a resistor, is located in the channels near the nozzles a predetermined distance therefrom. The resistors are individually addressed with a current pulse to momentarily vaporize the ink and form a bubble which expels an ink droplet. As the bubble grows, the ink bulges from the nozzle and is contained by the surface tension of the ink as a meniscus. As the bubble begins to collapse, the ink still in the channel between the nozzle and bubble starts to move towards the collapsing bubble causing a volumetric contraction of the ink at the nozzle and resulting in the separation of the bulging ink as a droplet. The acceleration of the ink out of the nozzle while the bubble is growing provides the momentum and velocity of the droplet in a substantially straight line direction towards a recording medium, such as paper.

The specific details of the separation of the ink from its physical surroundings, the ink channel and its orifice, determine to a large extent the direction in which the ink will travel to the paper and thus determine where the mark on the paper will be made. Any microscopic irregularity that would affect the isotropy of this ink-orifice separation process will usually cause the ink to travel in an uncontrolled and not intended direction, that is, for example, not orthogonal to the plane defined by the orifice. This results in poor quality of the images and text that are printed on the paper. Such irregularities include pools of ink which collect around the orifice from previous jet firing. Microscopic irregularities of the orifice can be avoided by providing a coating on the exit orifice that repels the ink that is used for the printing process. To avoid or minimize ink drop deflection problems which can lead to subsequently printed images of poor quality, ink jet head components should be coated with one or more ink repellant layers. Examples of such ink repellant coatings are disclosed, for example, in U.S. Pat. No. 5,073,785, which was previously incorporated by reference herein in its entirety. This patent discloses processes for minimizing or avoiding ink drop deflection in ink jet devices which comprise coating the front face of ink jet head components with amorphous carbon, hydrogenated amorphous carbon, halogenated amorphous carbon, fluorinated amorphous carbon or mixtures thereof, and the like.

Fluoropolymer thin films deposited by plasma enhanced chemical vapor deposition are also ink repellant and can be used as front face coatings for thermal ink jet die modules. An underlayer made of a material such as amorphous or diamond-like carbon may be used between a substrate and the fluoropolymer film to promote adhesion between these layers and to improve front face durability, although the amorphous carbon layer is not always necessary.

The adhesion between the front face substrate and the carbon layer or fluoropolymer layer is important to the performance of the ink jet device. Cleaning or "descumming" steps are typically carried out to remove contaminants originating from the dicing operation from the substrate. Otherwise, such contaminants might cause adhesion failure of the carbon layer. These include: blade resins; epoxy materials used to bond the heater and channel wafer; and organic polymer materials such as polyimide which are coated on the heater wafer to form wells within the channels in which the ink resides until pulsing is required. Cleaning processes may use a reactive plasma chemical reaction wherein the contaminants form a volatile compound which is then pumped from the deposition chamber. For example, an oxidizing gas such as oxygen or nitrous oxide has been used to remove polyimide debris caused by dicing from the front face of thermal ink jet dies.

However, cleaning processes using an oxidizing gas such as oxygen or nitrous oxide are not suitable when fluoropolymer coating processes are used. For reasons of cost, convenience, material robustness and simplicity, it is preferred that all steps in the front face coating process be carried out in a single chamber plasma processing system. However, fluoropolymer deposits accumulate and are difficult to totally remove from the internal surfaces of the plasma processing chamber such as on the walls and the electrodes. A nitrous oxide or oxygen gas or other oxidizing plasma etches the fluoropolymer deposits and causes them to redeposit uncontrollably on the substrates. This results in adhesion failure of the amorphous carbon intermediary layer or the controlled fluoropolymer front face coating layer itself if no intermediary layer is used. Etching of the fluoropolymer deposits releases radical fluorine and fluorine-containing gases, e.g., $CF_4$, into the deposition system. These fluorine-containing species can adsorb on internal chamber surfaces and are generally difficult to remove from the deposition system by simple vacuum pumping techniques even under ultra high vacuum conditions. If the amorphous carbon underlayer is deposited while these fluorine-containing species are present, the result is a contaminant deposit, which typically has poor adhesion to the substrate, at the interface. This has been demonstrated during front face coating applications on thermal ink jet dies and can be a limiting factor for the development of improved front face coatings. Multiple chamber deposition systems can be used to address the problem by preparing the substrate (i.e., cleaning and carbon layer deposition) in one chamber and applying the fluoropolymer film in a second, thereby isolating the contamination source. However, these systems are expensive, occupy additional space and are more prone to mechanical failure than single chamber systems. In addition, the presence of oxygen atoms generated in the plasma and fluorine-containing species etched off the internal surfaces results in uncontrolled etching of the polyimide and crystalline silicon around the nozzle faces. This distorts the nozzles and causes drop misdirection and subsequent print quality defects.

Japanese Patent Document 58-190,898 discloses the use of a hydrogen plasma to remove adsorbed gases on a substrate prior to molecular beam epitaxy deposition. An article by Y. Saito amd A. Yoshida (J. Electrochem. Soc., Vol. 139, No.12, December 1992) describes a method of removing adsorbed fluorine from the surface of substrates using hydrogen gas at an elevated substrate temperature. The article does not describe the use of plasma nor fluoropolymer film deposition. U.S. Pat. No. 5,043,747 discloses the use of a front face coating formed by a wet coating of an aromatic fluoropolymer which is subsequently cured. Plasma processing is not used, nor is the use of a substrate cleaning process disclosed.

SUMMARY OF THE INVENTION

The use of a hydrogen plasma as a cleaning step for a surface to be subsequently coated, such as the front face of thermal ink jet devices, remedies the problems described above by reactively removing fluorine-containing species and contaminants from the deposition chamber and substrate prior to fluoropolymer and/or carbon underlayer deposition. The hydrogen plasma scavenges residual fluorine and fluorine-containing gases liberated by the cleaning step from the deposition system. Hydrogen atoms created in the plasma combine with fluorine to form hydrogen fluoride, which is efficiently pumped from the vacuum system. The hydrogen plasma serves as an efficient cleaning step, removing contaminants from the dicing operation and fluorocarbon deposits which can form on the substrate via redeposition during the cleaning step. The result is a clean substrate surface to which the carbon underlayer or fluoropolymer layer may bond and which is not contaminated by fluorocarbon deposits at the interface during the initial phases of underlayer film growth. The use of a hydrogen plasma to remove fluoropolymer contaminants and improve thin film adhesion adds virtually no cost to the process and equipment, can be done quickly (several minutes), and does not require additional processing equipment. It is compatible with manufacturing line systems as well as research processing equipment.

DETAILED DESCRIPTION OF PREFERRED EMBODIMENTS

Figure 1:
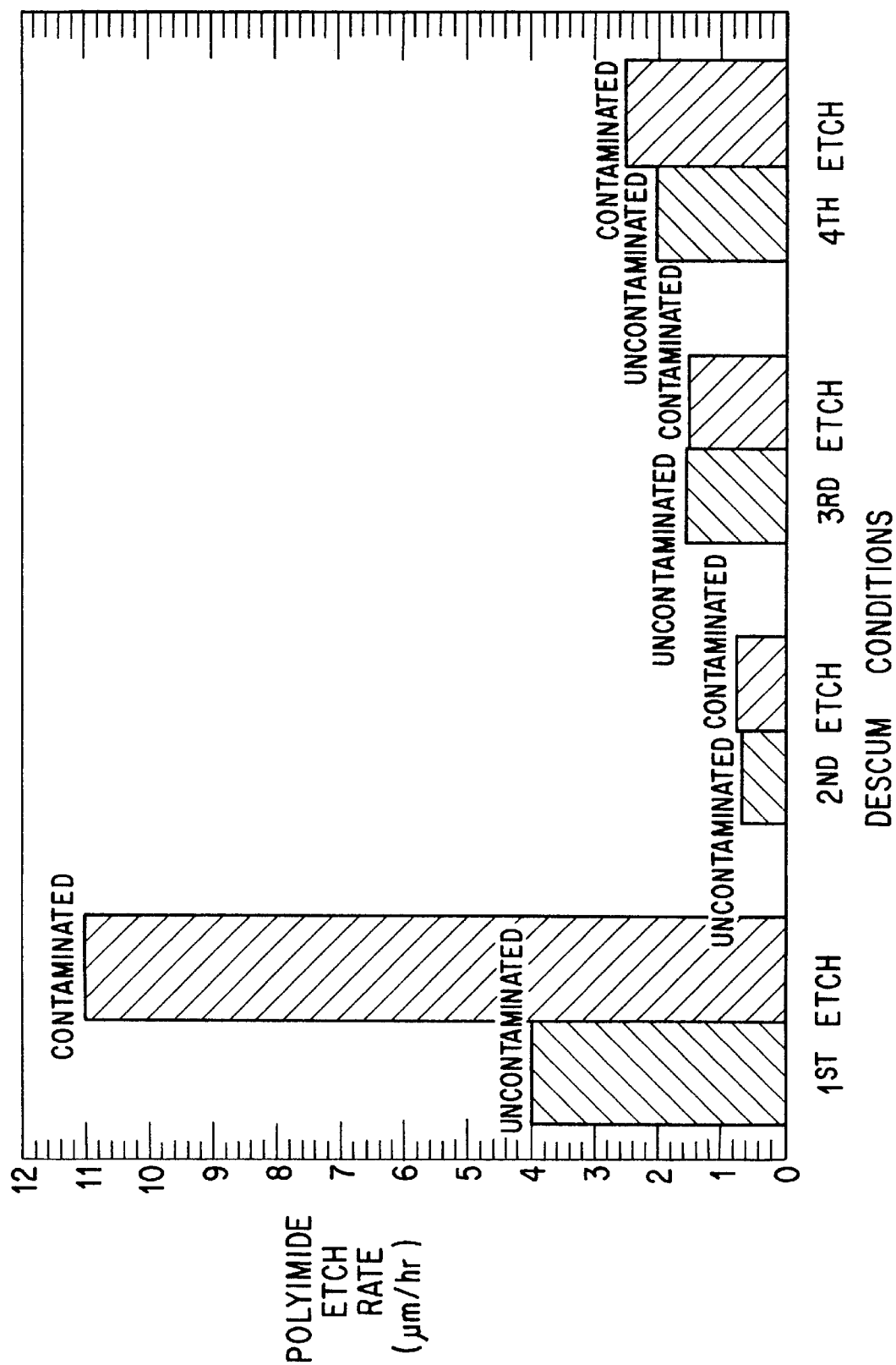
FIG. 1 illustrates polyimide etch rate as a function of cleaning conditions and fluorine-containing species in a reaction chamber.

In one embodiment, this invention provides a method of cleaning a substrate of a thermal ink jet device in a single chamber plasma processing system containing fluoropolymer deposits, treating said substrate with a hydrogen plasma. In other embodiments, the present invention is directed to methods of making a coated thermal ink jet device comprising (1) treating a substrate of said thermal ink jet device with a hydrogen plasma to clean the substrate; (2) optionally coating said cleaned substrate with an amorphous carbon layer; and (3) coating said substrate or amorphous carbon layer with a fluoropolymer layer.

The properties of the hydrogen plasma used in the method of this invention are chosen so as to provide maximum efficiency for removing fluorine-containing species. These include (1) low pressure (for example, less than 1000 mTorr) so that mean free paths are maximized, interaction of the hydrogen with fluorine is promoted and recombination of atomic hydrogen to form hydrogen gas is decreased; (2) high electrical power density (for example, greater than 0.2 W/cm$^2$) to maximize hydrogen gas dissociation; (3) large hydrogen gas flow rates (for example, greater than 50 sccm) to decrease residency time within the chamber and encourage quick removal of volatile species once formed (given a 10 liter vacuum system at 1000 mTorr with 50 sccm $H_2$, residency times would be less than 2.0 seconds); and (4) reactive ion etch conditions in which the substrate is electrically biased so that interaction of hydrogen ions created in the plasma with the substrate is encouraged to remove residual contaminants.

The cleaning process of the present invention is carried out under a pressure of preferably from about 10 to about 500 mTorr, more preferably from about 50 to about 300 mTorr, and most preferably about 200 mTorr. The temperature of the substrate during the cleaning process preferably ranges from about 25° C. to about 400° C., more preferably from about 150° C. to about 300° C., and most preferably about 250° C. The applied rf power density used to generate the hydrogen plasma preferably ranges from about 0.03 to about 0.65 watts/cm$^2$, more preferably from about 0.15 to about 0.50 watts/cm$^2$, and most preferably is about 0.30 watts/cm$^2$. The flow rate of hydrogen gas preferably ranges from about 10 to about 500 sccm, more preferably ranges from about 53 to about 300 sccm, and most preferably is about 100 sccm.

The method for cleaning thermal ink jet die devices according to the present invention can be carried out as follows. The die device is placed in an appropriate fixture for front face coating and loaded onto the lower electrode in a plasma processing system. An example of a suitable plasma processing system includes that manufactured by Plasma-Therm I.P., St. Petersburg, Fla. under model number Waf'r Batch 700. The substrate is raised to a temperature in the range of from about 25° C. to about 400° C. while the vacuum chamber is maintained at a pressure of from about 1.0 to about 200 mTorr, while purging with $N_2$ gas. After a period of time, for example about 1 hour, the $N_2$ purge is discontinued and $H_2$ gas is flowed into the system at a flow rate of from about 10 to about 500 sccm. A pressure of from about 10 to about 500 mTorr is maintained in the system. After allowing the system to stabilize for a period of, for example, about 2 minutes, from about 0.03 to about 0.65 watts/cm$^2$ rf power (13.56 MHz) is applied to the upper electrode and a plasma is generated. The plasma is allowed to continue for a period ranging from about 2 to about 200 minutes, preferably from about 10 to about 100 minutes and most preferably about 60 minutes, after which the rf power (13.56 MHz) is discontinued and the $H_2$ flow is stopped.

A layer of amorphous or diamond-like carbon is preferably deposited over the freshly cleaned surface of the substrate. Examples of suitable amorphous or diamond-like carbon layers and methods of depositing them on the cleaned substrate are disclosed, for example, in U.S. Pat. No. 5,073,785, which was previously incorporated by reference herein in its entirety. The amorphous carbon layer should contain carbon (at about 80 atomic percent) and hydrogen (at about 20 atomic percent) with less than 2 atomic percent each of oxygen, nitrogen and halogen contaminants in order that adhesion of the subsequently deposited fluoropolymer front face coating to the amorphous carbon intermediary layer be maximized. The thickness of the amorphous carbon layer preferably ranges from about 0.1 to about 1.0 microns and more preferably from about 0.2 to about 0.5 microns.

The carbon layer can be deposited using a hydrocarbon gas, such as ethylene, at an appropriate flow rate, e.g., about 30 sccm. After maintaining an appropriate pressure of, for example, about 200 mTorr, for a period of, for example, 3 minutes, about 100 watts of rf power (13.56 MHz) are applied to the lower electrode. The ensuing plasma is continued for a period of about 15 minutes until 2500 angstroms of the carbon layer are deposited. At this point, the rf power and ethylene flow are terminated.

The fluoropolymer front face coating can be deposited by flowing 30 sccm of a fluorocarbon, such as tetrafluoroethylene, into the processing chamber and maintaining a pressure of about 500 mTorr. After stabilizing for about 3 minutes, 50 watts of rf power (13.56 MHz) is applied to the upper electrode. The ensuing plasma is continued for about 20 minutes until about 2500 angstroms of the front face coating are deposited.

Following this final deposition, all gas flows are discontinued and the system is evacuated to a pressure of about 1 mTorr and then vented. The die devices can then be unloaded from the fixture.

Preferably, the cleaning, carbon layer deposition and fluoropolymer deposition steps in the method of this invention are all carried out in a single chamber plasma processing system.

The substrate cleaned according to the method of this invention can be any material, such as, for example, metal, e.g., aluminum, stainless steel and the like; insulating polymers, e.g., Mylar® (a polyester material commercially available from DuPont), Kapton® (a polyimide material commercially available from DuPont), polyimide and the like; glass; and crystalline silicon. Preferably, the substrate is made of crystalline silicon.

EXPERIMENTAL

EXAMPLE 1

Thermal ink jet die modules are placed in an appropriate fixture for front face coating and loaded onto the lower electrode in a plasma processing system (such as that manufactured by PlasmaTherm I.P., Inc., St. Petersburg, Fla. under model number Waf'r Batch 700). The substrate temperature is raised to 250° C. while the vacuum chamber is maintained at a pressure of approximately 100 mTorr while purging with $N_2$ gas. After 1 hour, the $N_2$ purge is discontinued and $H_2$ gas is flowed into the system at 100 sccm. A pressure of 200 mTorr is then maintained. After allowing the system to stabilize for two minutes, 200 watts of rf power (13.56 MHz) is applied to the upper electrode and a plasma is generated. The plasma is allowed to continue for 60 minutes, after which the rf power is discontinued and the $H_2$ flow is stopped. A layer of amorphous carbon is then deposited over the freshly cleaned surface of the substrates. The carbon layer is deposited using 30 sccm of ethylene ($C_2H_4$). After maintaining a pressure of 200 mTorr for 3 minutes, 100 watts of rf power (13.56 MHz) is applied to the lower electrode. The ensuing plasma continues for 15 minutes until 2500 angstroms of the carbon intermediary layer are deposited. At this point, the rf power and the $C_2H_4$ flow are terminated. The fluoropolymer front face coating is deposited by flowing 30 sccm of $C_2F_4$ into the chamber and maintaining a pressure of 500 mTorr. After stabilizing for 3 minutes, 50 watts of rf power is applied to the upper electrode. The ensuing plasma is continued for 20 minutes until 2500 angstroms of the front face coating are deposited. Following this final deposition all gas flows are discontinued and the system is evacuated to 1 mTorr and then vented to atmosphere. The die modules are then unloaded and evaluated.

EXAMPLE 2

Die modules are loaded as described in Example 1. The substrate temperature is raised to 150° C. while the vacuum chamber is maintained at a pressure of approximately 100 mTorr while purging with $N_2$ gas. After 6 hours, the $N_2$ purge is discontinued and $H_2$ gas is flowed into the system at 200 sccm. A pressure of 200 mTorr is then maintained. After allowing the system to stabilize for two minutes, 400 watts of rf power (13.56 MHz) is applied to the lower electrode and a plasma is generated. The plasma is allowed to continue for 10 minutes, after which the rf power is discontinued and the $H_2$ flow stopped. The amorphous carbon and the fluoropolymer front face coating layer are prepared as in Example 1.

EXAMPLE 3

Die modules are loaded as described in Example 1. The substrate temperature is raised to 150° C. while the vacuum chamber is maintained at a pressure of approximately 100 mTorr while purging with $N_2$ gas. After 6 hours, the $N_2$ purge is discontinued and $H_2$ gas is flowed into the system at 100 sccm. After allowing the system to stabilize for two minutes, 200 watts of rf power (13.56 MHz) is applied to the upper electrode and a plasma is generated. The plasma is allowed to continue for 60 minutes, after which the rf power is discontinued and the $H_2$ flow is stopped. The fluoropolymer layer is then deposited directly onto the clean surface using the conditions described in Example 1.

The die modules prepared in the preceding examples are evaluated by microscopically examining the quality of the front face coating. Due to light interference, the coating exhibits an easily detectable color tint which is determined by its thickness. Thus, failure in the adhesion of the coating is obvious. Following coating, the devices prepared in the above examples are found to have excellent adhesion based on standard tape test methods. The samples are then print tested using a standard water-based thermal ink jet ink. Coating adhesion was then evaluated again and found to be excellent. As a final test, the devices were placed in an environment of elevated temperature (70° C.) and humidity (95% relative humidity). After 30 days exposure there was no evidence of coating delamination and tape test evaluation revealed no degradation in coating integrity. In contrast, if $N_2O$ or $O_2$ was used to reactively clean the substrates, adhesion failure would always be observed upon initial examination after coating or following print testing with ink. This failure is due to the presence of a fluorocarbon contaminant layer at the interface which is uncontrollably redeposited due to etching of the fluoropolymer layer coated on the internal surfaces of the chamber.

EXAMPLE 4 AND COMPARATIVE EXAMPLES A–C

FIG. 1 shows polyimide etch rate as a function of descumming conditions and chamber.

Figure 2:
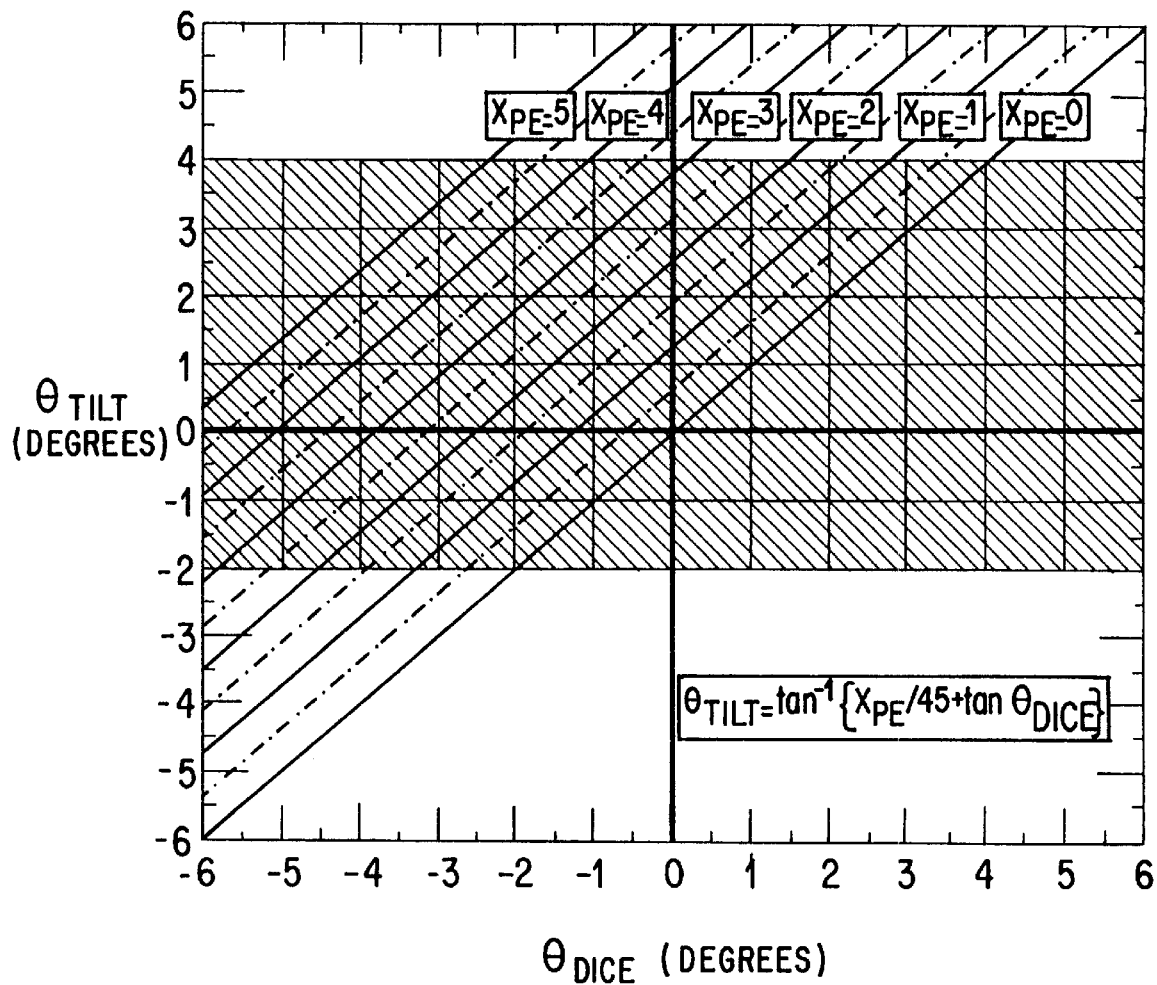
FIG. 2 is a diagram showing effective meniscus tilt angle in relation to Dicing Angle ($\theta_{TILT}$) and Polyimide Etchback ($X_{PE}$).

As shown in FIG. 1, experiments are carried out using the standard $N_2O$ cleaning condition and three sets of conditions using hydrogen plasma in two separate processing chambers: an "uncontaminated" chamber in which no fluoropolymers have been deposited; and the "contaminated" chamber which has been used for fluoropolymer depositions. The systems are otherwise identical. The first etch is a $N_2O$ etch using standard conditions (20 sccm, 200 mT, 120 W, RIE). Each of etch 2, 3 and 4 is an $H_2$ etch. The second etch is at a low flow (20–70 sccm), low power (210 W) and 200 mT, PE. The third etch is at a medium flow (150 sccm), medium power (300 W), 200 mT, PE. The fourth etch is at a high flow (200–640 sccm), high power (400 W), 200 mT, PE. Thermal ink jet die modules are used in this example (as in all other examples herein) in which the nozzle orifice is composed of crystalline silicon from the channel wafer and polyimide which is coated on a crystalline silicon heater wafer and subsequently patterned to form wells within the channels to contain the ink between jetting cycles. Polyimide thus composes the the bottom portion of the ink jet channels and nozzles. During the cleaning step this polyimide can be etched along with the contaminants on the front face. If uncontrolled and variable, overetching can occur and print quality defects can arise due to distortion of the ink nozzle. Limits to the degree of allowable polyimide etching without resulting in objectionable print quality defects are shown in FIG. 2. FIG. 2 is a diagram showing the effective meniscus tilt angle $\theta_{TILT}$ in relation to the dicing angle $\theta_{DICE}$ and polyimide etchback $X_{PE}$. Effective meniscus tilt angle $\theta_{TILT}$ refers to the angle of the plane of the ink meniscus with respect to the channel normal. Dicing angle $\theta_{DICE}$ refers to the front face dicing angle measured from a line perpendicular to the central axis of the channel. The data has been expressed in terms of the device processing parameters through the use of simple trigonometric relationships. If the front face dicing angle $\theta_{DICE}$, polyimide etchback $X_{PE}$ and the distance H between the upper surface of the parallel grooves located on the channel are known, the effective meniscus tilt angle may be calculated from the following formula:

$$\theta_{TILT} = \tan^{-1}\{X_{PE}/H + \tan \theta_{DICE}\} \quad (1)$$

In FIG. 2, the allowed range of effective meniscus tilt angle $\theta_{TILT}$ values (cross hatched region) is plotted against these manufacturing process parameters so that appropriate tolerance tradeoffs for defect-free devices can be determined. The data plotted in this figure have been calculated with the channel height distance H being equal to 45 μm. Various values of the polyimide etchback are shown in FIG. 2.

As shown in FIG. 1, when using $N_2O$, the polyimide etch rate increases from about 4 μm/hr to about 11 μm/hr as the processing environment becomes fluoropolymer-contaminated. Although not illustrated, the variability also increases dramatically in the fluoropolymer chamber (values between 6 μm/hr and 24 μm/hr have been obtained). This increase in etch rate and variability is evidence of the presence of fluorine-containing species in the chamber which have been liberated by the oxidizing plasma. When using a hydrogen plasma, the overall etch rates are lower, but consistency between chambers is obtained, as is reproducibility (typically less than a few tenths of a micron/hour variability is observed). Thus, FIG. 1 shows that use of a hydrogen plasma in place of nitrous oxide as the cleaning gas stabilizes the polyimide etch rate and eliminates the effects of the fluorine-containing species on this etch rate.

EXAMPLES 5–10 AND COMPARATIVE EXAMPLES D AND E

Figure 3:
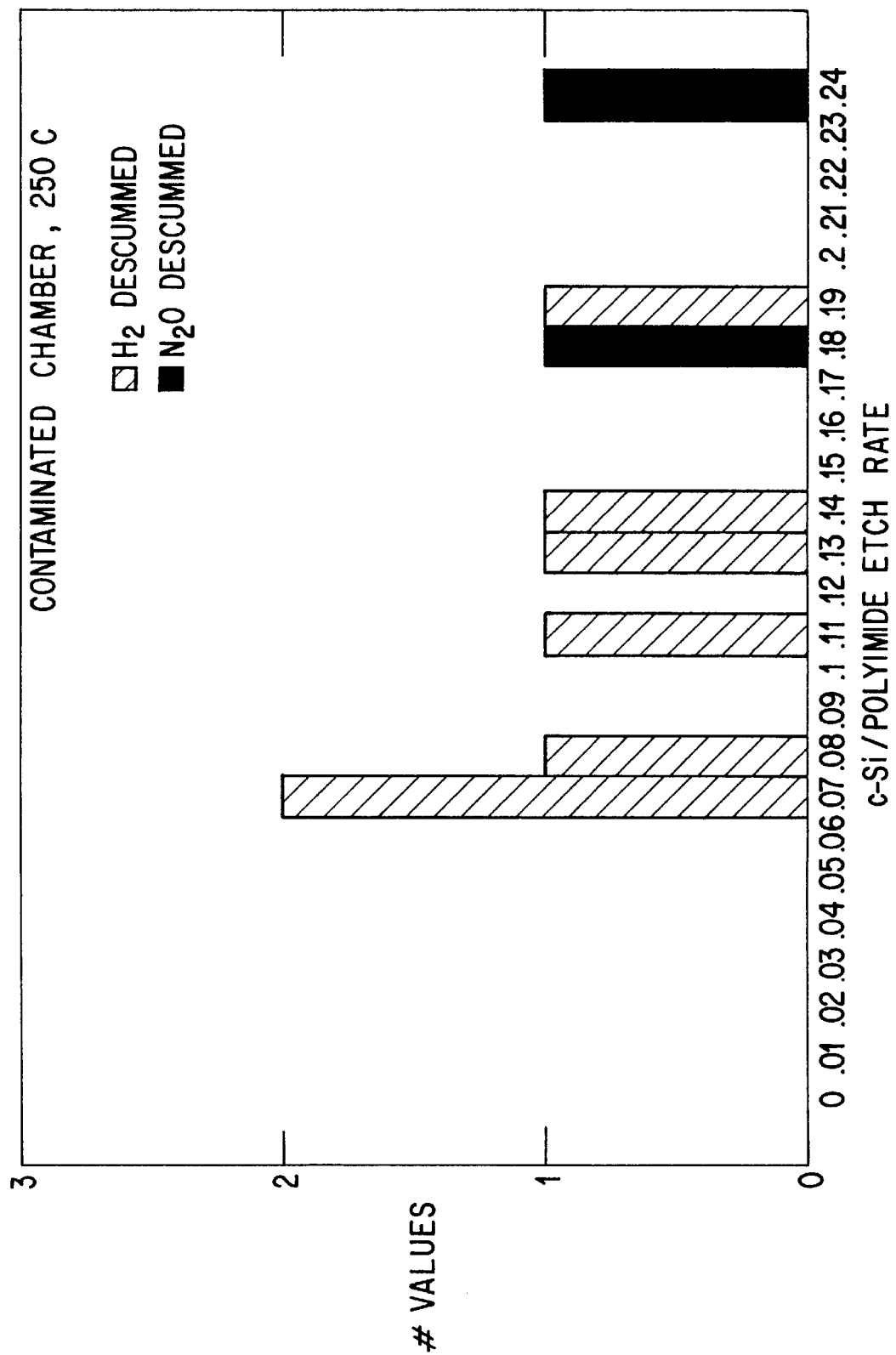
FIG. 3 illustrates etch rate selectivity versus the type of cleaning plasma.

It is preferred during the cleaning step that polyimide and other organic dicing residue be etched at significantly higher rates than the crystalline silicon composing the thermal ink jet device. FIG. 3 shows etch rate selectivity versus descum gas. In FIG. 3, etch rates are compared for samples processed in the fluoropolymer-contaminated chamber using standard nitrous oxide cleaning conditions and several conditions using a hydrogen plasma. Selectivity ratios of about 0.2 (0.2 μm of crystalline silicon are etched for every 1.0 μm of polyimide) are obtained using nitrous oxide, while values as low as 0.07 have been obtained using hydrogen gas. The result is virtually no etching of the crystalline silicon during the cleaning step and negligible distortion of the channel nozzles and thus no droplet misdirection.

EXAMPLES 11–13 AND COMPARATIVE EXAMPLE F

Eight electrically inactive die modules are used for each of the cleaning process conditions listed in Table 1. A plasma processing system contaminated with fluoropolymer deposits on the internal surfaces is used. The undercut value is the amount of polyimide removed at the base of the nozzle due to the cleaning step and is used to standardize the level of cleaning performed.

TABLE 1

Examples 11–13 and Comparative Example F: Process Conditions

| Example No. | Cleaning Gas | Flow (sccm) | Power (W) | Undercut (μm) | Time (min) |
|---|---|---|---|---|---|
| 11 | $H_2$ | 30 | 210 | 1.8 | 100 |
| 12 | $H_2$ | 150 | 310 | 1.3 | 60 |
| 13 | $H_2/N_2O$ | 150/20 | 310/120 | 1.5 | 5/15 |
| F | $N_2O$ | 20 | 20 | 1.8 | 7.5 |

The cleaning process is followed by deposition of a standard diamond-like carbon layer. The samples are then each exposed to high humidity conditions (95% relative humidity at 70° C.) in a humidity chamber and then examined after 5, 14 and 24 days for adhesion quality. The adhesion quality of the samples is shown in Table 2.

TABLE 2

Examples 11–13 and Comparative Example F:
Carbon Layer/Substrate Adhesion
After Humidity/Temperature Exposure

| Example No. | Initial Adhesion | Adhesion After 5 Days Exposure | Adhesion After 14 Days Exposure | Adhesion After 24 Days Exposure |
|---|---|---|---|---|
| 11 | all OK | all OK | all OK | all OK |
| 12 | all OK | all OK | all OK | all OK |
| 13 | all OK | all OK | all OK | couple dies show minor failure around few channels |
| F | all OK | failure starting around channels | all show failure around channels | all show failure around channels |

Table 2 shows that the hydrogen plasma-cleaned devices continue to show excellent diamond-like carbon/substrate adhesion even after 24 days, while the nitrous oxide cleaned-devices begin showing adhesive failure after only five days exposure. Even the two-step cleaning process in Example 13 shows acceptable adhesion. X-ray photoelectron spectroscopy compositional analysis shows that a thin fluoropolymer layer redeposits on the front face of the die during the nitrous oxide descumming step. This contaminant layer is believed to cause the diamond-like carbon adhesion failure and is prevented from depositing and/or removed by the hydrogen plasma. Subsequent coating of these devices with a fluoropolymer front face coating would yield a device of acceptable adhesion and performance.

EXAMPLE 14

Example 12 is repeated on eight electrically active die modules except that the modules are each cleaned and then coated with a diamond-like carbon layer and then with a fluoropolymer layer. Unlike results achieved with nitrous oxide-cleaning, all eight modules continue to show excellent adhesion even after print quality evaluation.

What is claimed is:

1. A method of cleaning internal surfaces of a chamber containing fluoropolymer deposits and at least one substrate, comprising:
    a) placing at least one substrate in a chamber including internal surfaces having fluoropolymer deposits thereon, said at least one substrate having no fluoropolymer deposits thereon;
    b) generating a hydrogen plasma from a $H_2$ gas flow in said chamber containing said at least one substrate; and
    c) treating said internal surfaces of said chamber and said at least one substrate having no fluoropolymer deposits thereon with said hydrogen plasma to remove said fluoropolymer deposits from said internal surfaces, and subsequently removing hydrogen and fluoropolymer material that formed said fluoropolymer deposits from said chamber, such that the removed fluoropolymer material does not redeposit in said chamber on said at least one substrate during treating.

2. A method according to claim 1, wherein said treated chamber is at a temperature of from about 25° C. to about 400° C. and at a pressure of from about 10 to about 500 mTorr, and the $H_2$ gas flow has a flow rate of from about 10 to about 500 sccm and said hydrogen plasma is generated by rf power having a frequency of about 13.56 MHz and a power density of from about 0.03 to about 0.65 watts/cm$^2$.

3. A method according to claim 1, wherein said chamber is treated at a temperature ranging from about 150° C. to about 300° C. and a pressure from about 50 to about 300 mTorr, the $H_2$ gas flow has a flow rate of from about 50 to about 300 sccm, and the hydrogen plasma is generated by rf power having a frequency of about 13.56 MHz and a power density of from about 0.15 to about 0.50 watts/cm$^2$.

4. A method according to claim 1, wherein said chamber is treated at a temperature of about 250° C. and a pressure of about 200 mTorr, the $H_2$ gas flow has a flow rate of about 100 sccm, and the hydrogen plasma is generated by rf power having a frequency of about 13.56 MHz and a power density of about 0.30 watts/cm$^2$.

5. A method of forming a coated substrate in a chamber of a plasma processing system, comprising steps of:
    a) placing a substrate having no fluoropolymer deposits thereon in a chamber of a plasma processing system;
    b) generating a hydrogen plasma from a $H_2$ gas flow in the chamber containing said substrate having no fluoropolymer deposits thereon;
    c) cleaning internal surfaces of said chamber with the hydrogen plasma to remove fluoropolymer deposits formed on the internal surfaces during a substrate fluoropolymer coating operation performed in said chamber prior to the step (a), such that the removed fluoropolymer material that formed said fluoropolymer deposits does not redeposit in said chamber on said substrate;
    wherein said substrate having no fluoropolymer deposits thereon is exposed to no oxygen-containing plasma after being placed in the chamber and before the step (c); and
    d) subsequently to the step (c), coating said substrate with a fluoropolymer layer.

6. A method according to claim 5, wherein the step (d) comprises coating said substrate with an amorphous carbon layer and then coating said amorphous carbon layer with the fluoropolymer layer.

7. A method according to claim 5, wherein the steps (a)–(d) are carried out in a single chamber.

8. A method according to claim 5, wherein said chamber is treated at a temperature of from about 25° C. to about 400° C. and at a pressure of from about 10 to about 500 mTorr and the $H_2$ gas flow has a flow rate of from about 10 to about 500 sccm and said hydrogen plasma is generated by rf power having a frequency of about 13.56 MHz and a power density of from about 0.03 to about 0.65 watts/cm$^2$.

9. A method according to claim 3, wherein said chamber is treated at a temperature ranging from about 150° C. to about 300° C. and a pressure from about 50 to about 300 mTorr, the $H_2$ gas flow has a flow rate of from about 50 to about 300 sccm, and the hydrogen plasma is generated by rf power having a frequency of about 13.56 MHz and a power density of from about 0.15 to about 0.50 watts/cm$^2$.

10. A method according to claim 3, wherein said chamber is treated at a temperature of about 250° C. and a pressure of about 200 mTorr, the $H_2$ gas flow has a flow rate of about 100 sccm, and the hydrogen plasma is generated by rf power having a frequency of about 13.56 MHz and a power density of about 0.30 watts/cm$^2$.

11. A method according to claim 5, wherein the substrate comprises at least one member selected from the group consisting of a metal, an insulating polymer, a glass, and a crystalline silicon.

12. A method according to claim 5, wherein the substrate comprises polyimide.

13. A method according to claim 5, wherein the substrate is a thermal ink jet device.

14. A method of forming a coated substrate in a plasma deposition chamber, comprising steps of:

a) placing a substrate having no fluoropolymer material thereon in a plasma deposition chamber;

b) generating a hydrogen plasma from a $H_2$ gas flow in the plasma deposition chamber containing the substrate;

c) treating internal surfaces of the chamber and the substrate having no fluoropolymer material thereon with the hydrogen plasma to remove fluoropolymer deposits on the internal surfaces, such that the removed fluoropolymer material that formed said fluropolymer deposits does not redeposit on said substrate during treating;

d) subsequently to the step (c), coating said substrate with an amorphous carbon layer; and e) coating said amorphous carbon layer with a fluoropolymer layer.

15. A method according to claim 14, wherein said chamber is treated at a temperature ranging from about 150° C. to about 300° C. and a pressure of from about 50 to about 300 mTorr, the $H_2$ gas flow has a flow rate of from about 50 to about 300 sccm, and the hydrogen plasma is generated by rf power having a frequency of about 13.56 MHz and a power density of from about 0.15 to about 0.50 watts/cm$^2$.

16. A method according to claim 14, wherein the substrate comprises at least one member selected from the group consisting of a metal, an insulating polymer, a glass, and a crystalline silicon.

17. A method according to claim 14, wherein the substrate comprises a polyimide.

18. A method according to claim 14, wherein the substrate is a thermal ink jet device.

19. A method of treating internal surfaces of a chamber, comprising:

a) coating a first substrate using a fluoropolymer-forming plasma in said chamber, said coating also forming fluoropolymer deposits on said internal surfaces of said chamber;

b) subsequently to the coating, treating said internal surfaces of said chamber with a hydrogen plasma while a second substrate having no fluoropolymer deposits thereon is disposed in said chamber, so as to remove said fluoropolymer deposits from said internal surfaces such that the removed fluoropolymer material that formed said fluropolymer deposits on said internal surfaces does not redeposit on said second substrate during treating; and c) removing hydrogen and the removed fluoropolymer fluoropolymer material from said chamber.

20. A method of forming a coated substrate in a chamber of a plasma processing system, comprising steps of:

a) placing a substrate in a chamber of a plasma processing system;

b) generating a hydrogen plasma in the chamber containing the substrate;

c) treating internal surfaces of the chamber and the substrate with the hydrogen plasma to remove fluoropolymer deposits that were formed on the internal surfaces during a substrate fluoropolymer coating operation performed in the chamber prior to the step (a), such that the removed fluoropolymer material that formed the fluropolymer deposits does not redeposit in the chamber on the substrate during treating;

wherein the internal surfaces of the chamber and the substrate are not treated with an oxygen-containing plasma after the substrate is placed in the chamber and prior to the step (c); and d) subsequently to the step (c), coating the substrate with a fluoropolymer layer.

* * * * *